United States Patent [19]

Meyers et al.

[11] Patent Number: 4,594,690
[45] Date of Patent: Jun. 10, 1986

[54] DIGITAL STORAGE APPARATUS INCLUDING SECTIONS EXHIBITING DIFFERENT ACCESS SPEEDS

[75] Inventors: Richard F. Meyers, Sindelfingen; Francis Rossi, Boeblingen; Werner Strähle, Dettenhausen, all of Fed. Rep. of Germany

[73] Assignee: International Business Machines Corporation, Armonk, N.Y.

[21] Appl. No.: 624,316

[22] Filed: Jun. 25, 1984

[30] Foreign Application Priority Data

Jul. 27, 1983 [EP] European Pat. Off. ........ 83107386.1

[51] Int. Cl.⁴ .............................................. G11C 8/00
[52] U.S. Cl. .................................... 365/230; 365/189
[58] Field of Search ......................... 365/189, 230, 233

[56] References Cited

U.S. PATENT DOCUMENTS 3,983,544  9/1976  Dennison et al. .................. 365/205
4,354,232  10/1982  Ryan ................................ 365/230 X

FOREIGN PATENT DOCUMENTS 0019358  11/1980  European Pat. Off. ............ 365/230
0134822  3/1985  European Pat. Off. ............ 365/230

OTHER PUBLICATIONS

Patent Abstracts of Japan, vol. 3, No. 26 (E-95), Mar. 6, 1979, Kokai No. 54-4027.
Patent Abstracts of Japan, vol. 4, No. 100 (P-19) (582), Jul. 18, 1980, Kokai No. 55-58891.

Primary Examiner—Joseph A. Popek
Attorney, Agent, or Firm—William J. McGinnis, Jr.

[57] ABSTRACT

A digital storage includes several sections having different time characteristics. Such sections are operated in the overlap mode and include a common address and control circuit. The fast sections store data which are accessed more frequently or which are addressed first when data blocks are transferred. The digital storage may be used in a storage hierarchy comprising a cache storage and wherein only data blocks positioned at main storage address boundaries are transferred to the cache storage.

2 Claims, 8 Drawing Figures

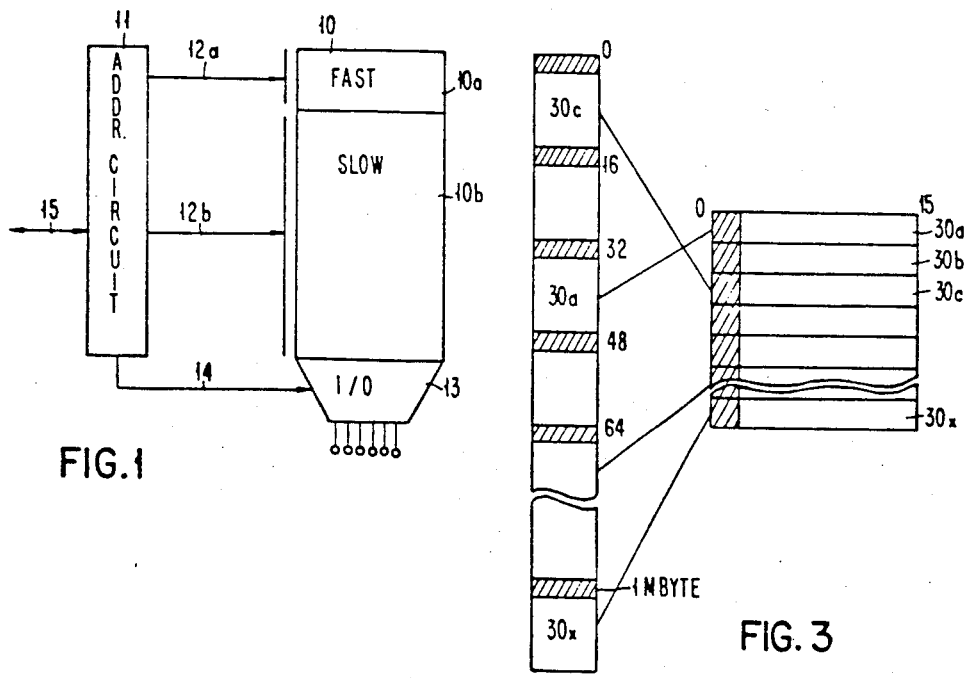
FIG. 1
FIG. 3
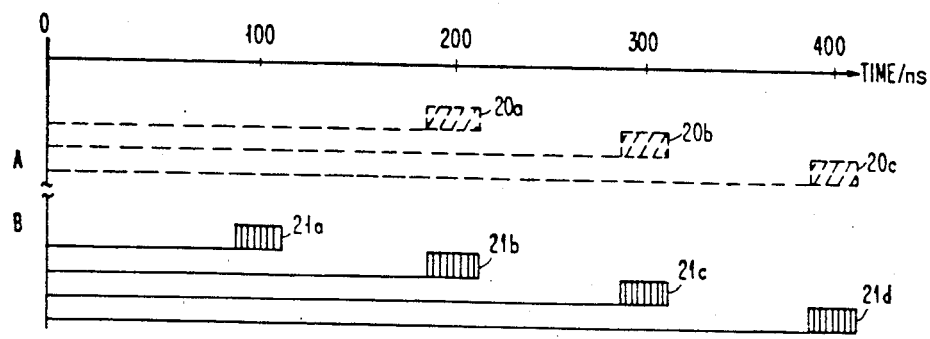
FIG. 2
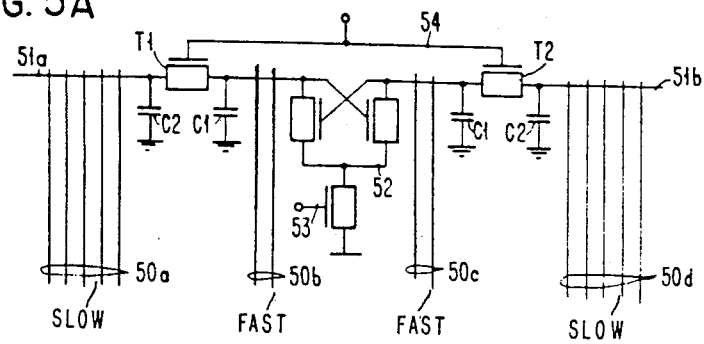
FIG. 5A

DIGITAL STORAGE APPARATUS INCLUDING SECTIONS EXHIBITING DIFFERENT ACCESS SPEEDS

BACKGROUND OF THE INVENTION

1. Field Of The Invention

The invention relates generally to data processing systems and, more particularly, to digital storage apparatus for such systems.

2. Description Of The Prior Art

The performance of conventional data processing systems is largely determined by the digital storages in which the programs and the data to be processed are contained. Ideally, a digital storage should have a very high capacity, a very short access time, a very high data rate for reading and writing, and a price which is as favorable as possible. In reality, these requirements cannot be simultaneously met for any particular storage type; fast storages, as bipolar technology affords, for example, are relatively expensive, whereas cheap storages are generally slow. With all of the known storage types a drop in speed is encountered if the total capacity of a storage system is increased.

To eliminate these difficulties, a wide variety of proposals have been made and realized, such as combining storages of different technologies and characteristics in one storage system, in order to improve its characteristics in the required manner. Examples of such storage systems may be found in what is known as virtual addressing where the fast main storage of a data processing system contains only the respective current data, while the data not needed are stored in disk storages; a further example are so called buffer storage architectures (cache systems), wherein between the main storage and the processor of a data processing system a fast buffer storage is provided which is administered fully automatically and which contains in each case the current data and instructions. Further examples of improving the performance of a data processing system by different storage types are the use of so called local storages in a processor (for accommodating registers or intermediate results) or the connection of different storage types to a common storage bus.

The design of such storage hierarchies requires relatively many control circuits and a relatively high degree of internal administration, so that their use is contemplated only for a high total capacity. An inherent disadvantage of such hierarchies is that the data contained in one storage are partly duplicated in another, so that a certain percentage of the total capacity of the storage system is not effectively utilized. In addition, the effectiveness of many storage hierarchies is not fully satisfactory, as not all performance deficiencies of a storage type can be readily remedied. Cache systems, for example, call for a main storage which is fast to access during block transfer, so that in the case of a miss occurring in a cache storage, the desired data can be rapidly transferred from the main storage to the processor (and simultaneously to the cache); in addition, a very high data rate is required for rapidly loading the cache storage. With the large main storages (up to several megabytes) used for up-to-date cache systems, it is essential to have a main storage which is as cheap as possible to manufacture.

BRIEF SUMMARY OF THE INVENTION

Among the objects of the present invention are to provide a digital storage which, while being relatively cheap to manufacture, has fast effective access and is suitable in particular for use in a storage hierarchy.

These and other objects of the invention will become apparent to those skilled in the art upon consideration of the following descriptions of the invention.

The invention is based on the fact that with many applications, the data are not transferred in single words (or parts of such words) but in blocks, each consisting of a plurality of words (or bytes). The addresses of the respective first data element of the blocks cannot be chosen arbitrarily but must be at so called address boundaries, so that the beginning addresses of all blocks are known. The invention proposes that a digital storage, which may be used, for example, as a main storage in a storage hierarchy, be designed such that different storage elements with different access times are employed. The storage elements (e.g., the storage chips or storage modules or areas of individual storage chips) are assigned in such a manner that the fast storage elements receive the first data elements of the storage blocks. For reading a data block, it is therefore necessary to access the fast storage elements first which subsequently, after a short time has elapsed, supply the first data element of the block. The remaining, slow, storage elements, in which the remaining data of a block are stored, can be addressed simultaneously or staggered in time in response to the read request of the fast storage element, so that the operation of the storage elements overlaps in time and the remaining data elements are read very rapidly one after the other. Thus, the digital storage, designed to include elements of different performance rates, acts like a homogeneous storage with very short access times and very high data rates. As, on the other hand, only relatively few fast (and thus expensive) storage elements are required and the main part of the storage consists of slow (and cheap) storage elements, the resultant total price is very favorable; in addition, the entire combined storage requires only one addressing unit.

A preferred application of this storage concerns its use as a main storage in a cache system, wherein complete cache blocks (so called cache lines) are transferred from the main storage into the cache, irrespective of which element in the cache block has just been requested by the processor. In this case, the above-described access pattern exists for the stored data, so that the begin elements of all cache blocks may be easily assigned to the fast storage elements.

By using low performance storage elements without reducing the performance of the system as a whole, it is possible to employ also those storage elements that otherwise would have to be discarded during manufacture. The digital storage proposed in the present application may also be used for smaller computers, since it requires no internal administration means and may be used whenever data is to be read from storage in block form or other known assignments exist for storage access operations.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

BRIEF DESCRIPTION OF THE DRAWINGS

FIG. 1 is a schematic of a digital storage with sections having different access times and which are addressed jointly.

FIG. 2 is a schematic time diagram for reading a data block from a conventional storage and a storage according to the present invention.

FIG. 3 shows how the linear address space of a main storage and the data blocks contained in a cache storage preceding such main storage are associated with each other.

FIG. 5A is a schematic of the internal layout of a storage chip with different areas of short and longer access times.

DETAILED DESCRIPTION OF THE INVENTION

Figure 4A:
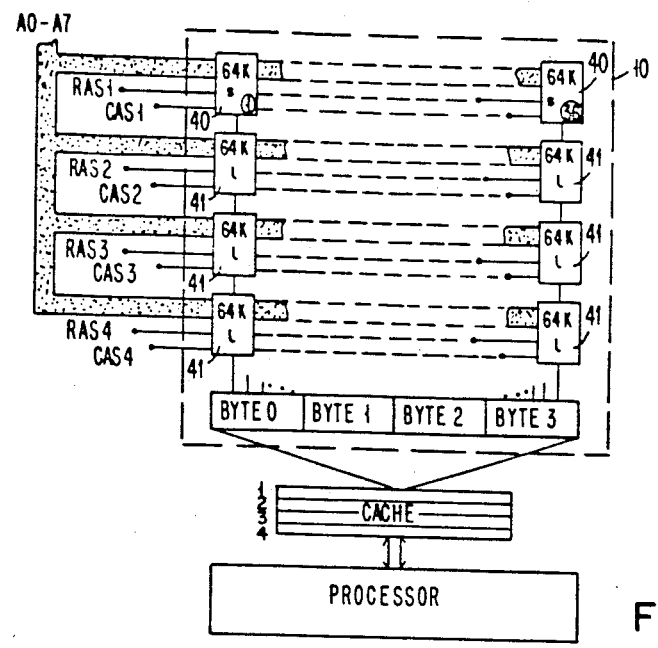
FIG. 4A shows the schematic layout of a main storage with storage chips having different time characteristics and storing data blocks transferred to a cache storage according to FIG. 3.

FIG. 1 shows the typical layout of a digital storage including at least two parts whose time characteristics differ with respect to storage access and which are addressed by a common control and address logic. The first, smaller, part $10a$ of the storage 10 comprises storage elements permitting a faster access to the stored information than the storage elements in part $10b$; part $10a$ may comprise, for example, storage modules with a single or several storage chips or the same storage chips may be used for both parts $10a$, $10b$ if the individual chip has a (smaller) section with a short access time and a (larger) section with a longer access time. The schematic partitioning of the sections according to FIG. 1 thus corresponds to the logical partitioning in the sense of address distinction and to a lesser degree to the physical distinction in the manner of the storage chips. For both parts $10a$, $10b$ there is a common control and address circuit 11 supplying separate selection signals for them (or through associated multi-core address lines $12a$, $12b$). The data input and output into and from storage, respectively, are effected by means of conventional input/output circuits 13 receiving control information from the control and address circuit 11 through lines 14. Through lines 15, the control and address circuit 11 is connected to the processor from which it receives, for example, a read instruction and the associated address.

For the proposed partitioning of a storage system, operating in response to common addressing means, into sections reacting at high speed and those reacting at a lower speed, it is essential that most access operations are effected to the fast sections (meaning that such sections contain data and/or instructions that are most frequently addresses) or that the fast and slow storage sections are operated in the overlap mode and the first access operations are always effected to the fast section. For the former approach it is essential to know the access frequency to the individual information stored. As this frequency may differ considerably from one program to another, the increase in speed of the entire storage, as afforded by the present invention, can be achieved only if the user himself assigns the data to the individual storage sections according to their access frequency.

A speed increase of the entire storage without any intervention may be achieved on the other hand if rather than considering individual storage access operations, larger data blocks are written into and read from storage, respectively. Wherever such block transfers occur, the speed potential of a storage with several sections can be utilized, provided it is possible to accommodate the first data elements of all blocks in the fast storage sections.

FIG. 2 is a time diagram illustrating the time gained with such a storage compared with a storage exclusively made up of elements contained in the slower section of the storage according to the invention. If, for example, these slower storage elements have an access time of 200 ns and if the access time to the fast storage elements is 100 ns, then in a conventional storage (row A) the first data element read $20a$ appears after 200 ns at the storage output; as a complete block is to be read, the reading of the second data element $20b$ is initiated overlapping in time with the access operation to the first data element $20a$, so that said second element is available as early as 100 ns after the first data element. This analogously applies to the further data elements $20c$, etc., which are also accessed in the overlap mode, since the individual storage elements (e.g., chips) may be operated fully independently of each other.

If, on the other hand, the first data element $21a$ is accessed in the fast storage section ($10a$), this data element appears as early as after 100 ns at the storage output; the subsequent data elements are addressed in the overlap mode as described above, so that a further data element is available in each case after 100 ns, until the whole block has been read.

By positioning the first data elements of a block in the fast storage sections, the first access time is reduced by 50 percent in this example; the proportion of fast storage elements of the entire storage depends on the number of data elements in a block and thus may be very small for large data blocks.

An important instance of data transfer in blocks concerns storage hierarchies where blocks are transferred, for example, between a cache storage and its associated main storage. If in such a case the desired data element (e.g., a byte) is not found in the cache storage in response to a processor request, this indicates a cache miss, so that the data element has to be transferred to the cache storage. As in all probability adjacent data elements will also be required by the processor later on, the wanted byte is transferred to the cache along with the entire block in which it is contained.

FIG. 3 is a schematic of such an example of cache blocks $30a$ to $30x$, each of which consists of 16 bytes; the first byte or the first group of bytes of each cache block is marked by hatched lines. For each of these cache blocks a duplicate is contained in main storage. The left-hand side of FIG. 3 shows, for example, the logically continuous address space of a 1 megabyte main storage, from which the cache blocks $30a$ to $30x$ of 16 bytes each are fetched. Each of these blocks begins in this address space at an address divisible by 16, so that the main storage addresses of the first data elements of all possible cache blocks are known. These addresses are also marked by hatched lines on the left-hand side of FIG. 3.

The access pattern necessary for the above described speed increase of a storage consisting of several sections is obtained for a cache storage according to FIG. 3 if all main storage addresses divisible by 16 (marked by hatched lines) are accommodated in the fast storage section.

FIG. 4A shows the layout of a main storage 10 meeting this requirement. The storage has a total capacity of 1 megabyte and consists of a 36×4 storage chip matrix, each of the chips comprising 64 kilobits and being structured according to the so-called 64K×1 bit organization (i.e., each bit is individually addressable). The first row with 36 chips 40 consists of fast storage chips with an access time of 100 ns (as can be easily obtained, for example, by means of dynamic field-effect transistor (FET) storages; the remaining rows consist of FET storage chips 42 with an access time of 200 ns, whose manufacturing costs are more favorable. The 36 storage chips in each row permit the simultaneous reading of 36 bits corresponding to four bytes of eight bits each plus four test or parity bits. The storages of a row are all addressed with the same chip selection signals RAS (Row Address Selection) and CAS (Column Address Selection). These signals are generated by the storage control and address unit 11 in FIG. 1 and will not be described here in greater detail, as they are known from the art. As each data block in the cache consists of 16 bytes, a total number of four groups, each comprising 4 bytes, has to be read, so that after 100 ns a further group of 4 bytes is available at the storage output.

Figure 4B:
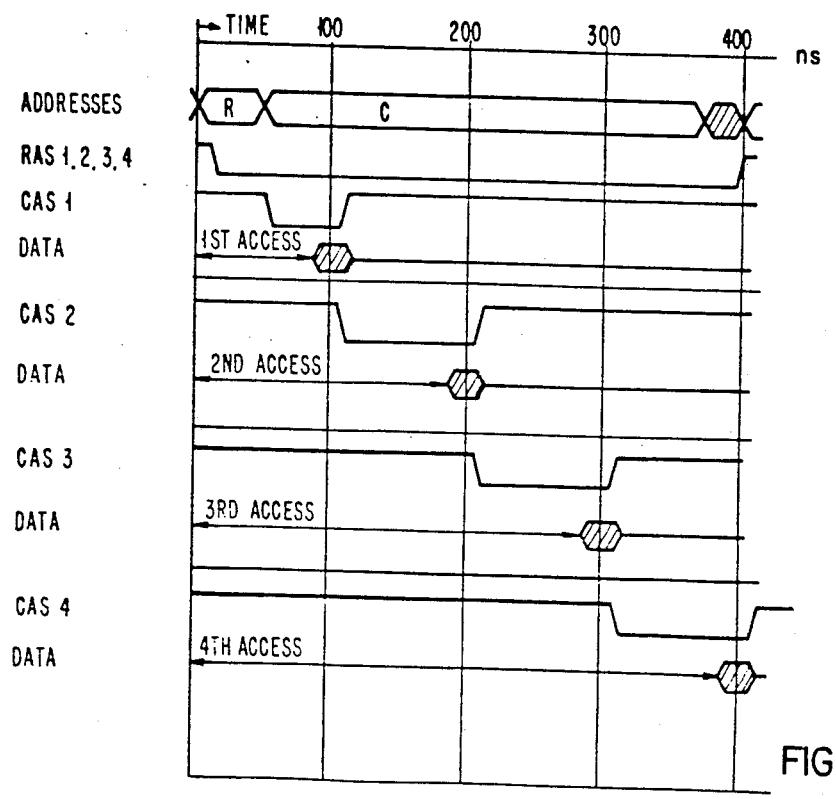
FIG. 4B is the time diagram for operating the storage according to FIG. 4A.

The time diagram for controlling the storage according to FIG. 4A is shown in FIG. 4B. The address, comprising a total number of 16 bits (for addressing 64 K blocks of 16 bytes each of a cache block read in four groups each comprising 4 bytes), is applied to the storage in two parts. The top-most row of FIG. 4B shows that the first address group R is applied first to be latched within the storage system for the entire access cycle (by the signals RAS 1, 2, 3, 4). Subsequently, after a short time has elapsed (about 50 ns), the second group C of 8 address bits is applied, remaining on the address lines for the reset of the access cycle and determining the read process by means of the successively emitted signals CAS 1 to CAS 4. The respective CAS signal disappears if a data block with four bytes (marked by hatched lines) becomes available at the storage output. The first signal CAS 1 is a so-called fast CAS signal which serves to select one of the fast storage chips. The different CAS signals are generated by the storage control and address unit 11, whose circuits have to be suitably connected for generating the first fast CAS signals. If the storage control and address unit is not changed, the proposed storage can be easily operated in the manner of a conventional storage system.

The net effect for users of a storage system as proposed in the present application is that an entire data block, consisting of several bytes, is made available as if by a storage made up of faster storage elements. The "data ready" signal, which is usually emitted by the storage system to the user, thus appears relatively early.

The physical storage organization according to FIG. 4A with storage chips of different time characteristics thus corresponds to the logical association of cache blocks with the address space of the main storage, as has been described with reference to FIG. 3. As at a total capacity of the main storage of 1 megabyte and at a block size of 16 bytes there are altogether 64K blocks and the first data element of each block, read in one access step, consists of four bytes, the first (fast) storage row of FIG. 4 must contain altogether 64K×4×8 bits=32 chips of 64K bits each (in addition to 4 chips for the parity bit in each byte).

The physical realization of a storage illustrated in FIG. 4A for fast access to data blocks is not the only conceivable one; it is also possible to provide several rows and/or columns in lieu of only one "fast" row. The optimum ratio of the capacity of fast to slow storage sections is determined by the size of the blocks, the distribution of the two sections in the storage as a whole, the ratio of the access times of slow to fast storage elements, their price, etc.

According to a further embodiment of the invention, it is possible to use structured storage chips having sections with short and long access times, respectively, in lieu of different storage chips all having different access times. An example of realizing such chips is shown in FIG. 5A, utilizing the fact that the access times within a chip depend to a considerable degree on the stray capacitances of the control lines to the individual storage nodes (storage cells). A chip with many storage cells requires long lines with correspondingly large stray capacitances for addressing the individual cells. For reducing these capacitances, it is proposed that blocking transistors, operated by the storage control, be incorporated in these lines, in order to switch off line portions, thus rendering their capacitance non-detrimental. Thus, the storage portions that are not off may be accessed at higher speeds.

For simplicity, the individual storage nodes have been omitted from FIG. 5A in which several word and bit lines are shown only schematically. The storage is symmetrically designed and includes bit lines 51a, 51b connected to a read circuit 52 receiving set signals on a line 53. The bit lines include transistors T1, T2 which can be switched jointly by a control line 54. If transistors T1, T2 are switched off, the read circuit 52 is not affected by capacitances C2 of the word lines 50a, 50d positioned behind these transistors. Thus, the storage chip is reduced to the word line groups 50b, 50c which have a much smaller capacitance C1 and, therefore, may be operated much faster than the entire storage chip. With respect to their function, the word lines 50b, 50c thus correspond to the fast storage chips of the first row in FIG. 4A. The fast and slow storage areas, respectively, on this chip are again addressed by the storage control and address unit.

The speed increase for the fast section of a storage chip according to FIG. 5A may be improved even further if suitable blocking transistors are also incorporated in the decoder of the storage chips, in order to disconnect the portion of the decoding means not needed (e.g. the binary decoder tree) together with its detrimental capacitances if only the fast section 50b, 50c of the chip is to be accessed. The blocking transistors, e.g., T1, T2 may also be activated by a setting pulse supplied by the computer.

Figure 5B:
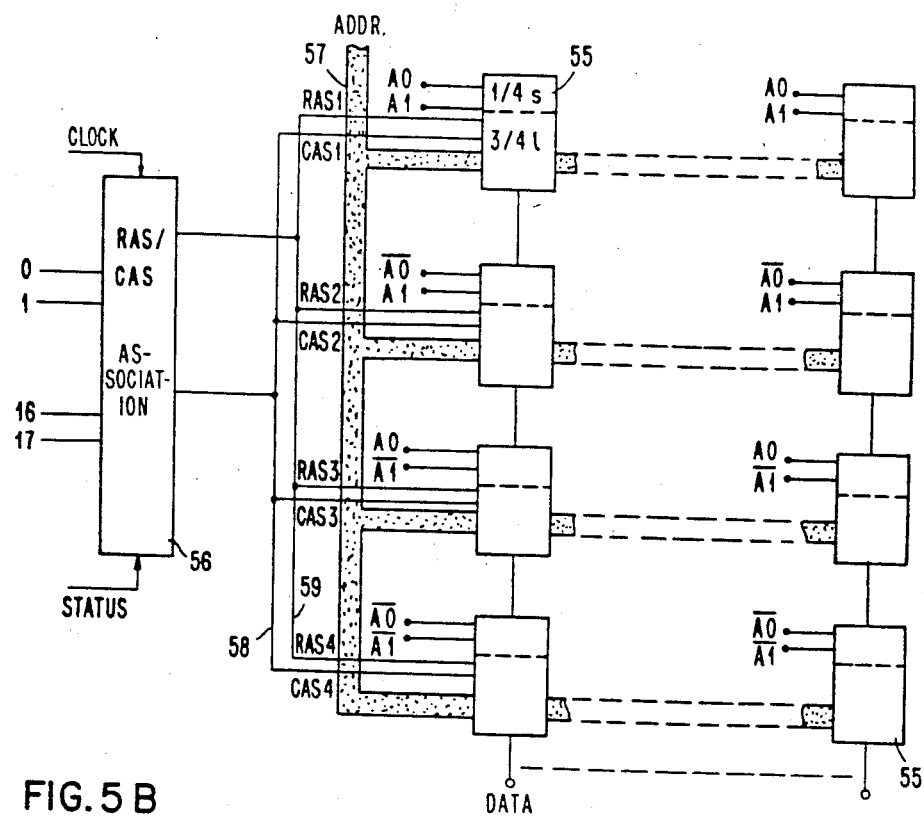
FIG. 5B is a schematic of the layout of a digital storage with a storage chip according to FIG. 5A.
Figure 5C:
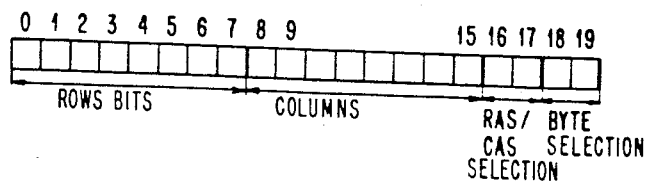
FIG. 5C shows the address field for addressing a digital storage according to FIG. 5B.

FIG. 5B is a schematic of the layout of a storage arrangement with storage chips 55 (according to FIG. 5A) consisting of a smaller fast section (s) and a larger slow section (1). In the storage of FIG. 5B with four rows of storage chips, the faster section of a chip corresponds to just a fourth of the total chip capacity. Similar to the storage system of FIG. 4A, the address bits are successively fed in two groups (A2-A7 and A8-A15, respectively) on the address bus 57 to the individual chips. The address bits A0 and A1 are fed directly to the fast sections of the individual storage chips, i.e., to the first chip row (A0, A1), to the second chip row in the form A0, A1, where A0 is the inverted signal A0, to the third chip row in the form A0, A1, and to the fourth chip row in the form A0, A1. As in such a case all storage chips require fast CAS signals (if their fast section is addressed), the association of the fast CAS signal has to be effected as a function of the respective address. For this purpose, bits 16 and 17 of the address are used which according to FIG. 5C consists of altogether 20 address bits corresponding to the assumed total storage capacity of 1 megabyte; the last two bits are used by byte selection and are not required for reading blocks of 4. The two bits 16, 17 uniquely define that row of storage chips which is to receive the fast CAS signal for the respective read process. The further storage access operations for reading an entire block are then effected as previously described by accessing the slower chip portions under suitable address control by the above-mentioned four bits.

The RAS and CAS signals are generated in a circuit 56 within the storage control and address unit 11; the inputs of the circuit 56 receives the address bits 16 and 17 as well as status and clock signals. From the outputs of circuit 56, the individual signal lines 58, 59 to the storage chips receive the RAS signals, necessary for the respective storage access operation, and the fast or slow CAS signals.

In circuit 56 shift registers may be employed, for example, for a cyclical continuous association of the fast CAS signals with the chip rows. The access sequence may be generalized if not only the CAS but also the RAS signals are generated as a function of the respective address. This is necessary, for example, if several fast storage access operations are to be effected in succession. Circuit 56 also receives the address signals A0 and A1 in this generalized form.

The foregoing describes a digital storage having a first section capable of fast access speeds and a second section exhibiting substantially slower access speeds. Such storage is relatively inexpensive to manufacture and is suitable for use in a storage hierarchy.

While only certain preferred features of the invention have been shown by way of illustration, many modifications and changes will occur to those skilled in the art. It is, therefore, to be understood that the present claims are intended to cover all such modifications and changes as fall within the true spirit of the invention.

Having thus described our invention, what we claim as new and desire to secure by Letters Patent is:

1. A digital storage apparatus organized in block storage format for storing a block of data where each block contains data words comprising:
    a plurality of word storage elements, a first word portion of said plurality of storage elements having an access time shorter than the access time exhibited by a second portion formed by the remainder of said plurality of word storage elements,
    address and control circuit means connected to said word storage elements, and common to said plurality of word storage elements to access a block of data, for generating different selection signals for said first and second portions of said plurality of storage elements, wherein at the initiation of a memory block access cycle said first word portion is accessed and thereafter the next word portions are accessed at a shorter time interval than a memory cycle time to compensate for the longer access time.

2. The apparatus of claim 1, wherein said word storage elements are integrated circuit chips having a first word portion and a second word portion,
    address means including word lines in common addressing said first word portion and said second word portion,
    blocking transistor means in said word lines between said first word portion and said second word portion and responsive to an address selection signal to partition said first word portion from said second word portion when said first word portion is accessed to allow for a faster access time.

* * * * *